United States Patent [19]

Kuchnir et al.

[11] Patent Number: 4,687,987
[45] Date of Patent: Aug. 18, 1987

[54] BEAM CURRENT SENSOR

[75] Inventors: Moyses Kuchnir, Elmhurst; Frederick E. Mills, Elburn, both of Ill.

[73] Assignee: The United States of America as represented by the United States Department of Energy, Washington, D.C.

[21] Appl. No.: 655,487

[22] Filed: Sep. 28, 1984

[51] Int. Cl.[4] ........................................... G01R 19/00
[52] U.S. Cl. .................................. 324/71.3; 324/127; 336/225; 336/229; 336/DIG. 1
[58] Field of Search .................. 324/117 R, 248, 71.3, 324/117 H, 127; 336/175, DIG. 1, 225, 229; 307/306

[56] References Cited

U.S. PATENT DOCUMENTS

| | | | |
|---|---|---|---|
| 3,050,683 | 8/1962 | Anderson | 324/117 R |
| 3,143,720 | 8/1964 | Rogers | 336/DIG. 1 |
| 3,244,974 | 4/1966 | Dumin | 324/117 R |
| 3,259,844 | 7/1966 | Casimir | 324/117 R |
| 3,390,330 | 6/1968 | Meyerhoff et al. | 324/117 R |
| 4,004,217 | 1/1977 | Giffard | 324/248 |
| 4,324,255 | 4/1982 | Barach et al. | 324/117 R X |

FOREIGN PATENT DOCUMENTS

| | | | |
|---|---|---|---|
| 169070 | 10/1983 | Japan | 324/248 |
| 739422 | 6/1980 | U.S.S.R. | 324/117 R |

OTHER PUBLICATIONS

Meservey, R., "Proposed Ammeter Using Flux Quantization", Journal of Applied Physics, vol. 39, No. 6, May 1968, pp. 2598–2605.

Tsubakihara, H., et al., "Specially Designed Cryostat for Measurement of Critical Current Density . . . ", Tech. Rep. Osaka Univ. (Japan), vol. 24, No. 1155–1190, Mar. 1974, pp. 37–41.

Harvey, I., "Cryogenic ac Josephson Effect emf Standard Using a Superconducting Current Comparator", Metrologia, vol. 12, No. 2, Dec. 1976, pp. 47–54.

Barbanera, S. et al., "A SQUID Device for ac Current Measurements . . . ", J. Appl. Phys., vol. 49, No. 2, Feb. 1978, pp. 905–909.

Pribory i Tekhnika Eksperimenta, No. 3, Flekkel, "A Meter for Measuring the Average Current in a Pulsed Beam . . . ", May–Jun. 1974, pp. 44–46.

Primary Examiner—Reinhard J. Eisenzopf
Assistant Examiner—Stephen M. Baker
Attorney, Agent, or Firm—Paul A. Gottlieb; Judson R. Hightower

[57] ABSTRACT

A current sensor for measuring the DC component of a beam of charged particles employs a superconducting pick-up loop probe, with twisted superconducting leads in combination with a Superconducting Quantum Interference Device (SQUID) detector. The pick-up probe is in the form of a single-turn loop, or a cylindrical toroid, through which the beam is directed and within which a first magnetic flux is excluded by the Meisner effect. The SQUID detector acts as a flux-to-voltage converter in providing a current to the pick-up loop so as to establish a second magnetic flux within the electrode which nulls out the first magnetic flux. A feedback voltage within the SQUID detector represents the beam current of the particles which transit the pick-up loop. Meisner effect currents prevent changes in the magnetic field within the toroidal pick-up loop and produce a current signal independent of the beam's cross-section and its position within the toroid, while the combination of superconducting elements provides current measurement sensitivites in the nano-ampere range.

12 Claims, 3 Drawing Figures

BEAM CURRENT SENSOR

CONTRACTUAL ORIGIN OF THE INVENTION

The U.S. Government has rights in this invention under Contract No. DE-AC02-CH03000 between the U.S. Department of Energy and Universities Research Association, Inc.

BACKGROUND OF THE INVENTION

This invention relates generally to electric current measuring apparatus and is particularly directed to the measurement of the current in a beam of charged particles.

Charged particle beams are used in various fields ranging from high energy experimental physics to medical applications. Beam currents for the various applications of charged particle beams may vary from tens of amperes to pico-ampere current levels. In the latter range of current values, the current may be difficult, if not impossible, to accurately measure.

One approach currently in use for measuring particle beam currents involves the use of a flux gate magnetometer. This zero flux current transformer includes a supermalloy pick-up device which is positioned adjacent the particle beam to be measured and is magnetized by the magnetic field of the beam. An AC signal is applied to the thus magnetized supermalloy pick-up device and the extent of magnetization, which corresponds to the particle beam current intensity, is measured in terms of a second harmonic of the AC input signal. This approach, however, is of limited use at extremely low currents, e.g., in the range of nano-amperes. In addition, accurate current measurements require somewhat precise alignment of the particle beam with the magnetized supermalloy material. However, precisely locating and positioning the charged particle beam in many cases is extremely difficult, particularly where very small beam currents are involved.

The present invention is intended to overcome the aforementioned limitations of the prior art by providing a particle beam current sensor which is generally insensitive to the exact location and cross-section of a beam of charged particles in providing highly accurate beam current measurements for direct currents down to the nano-ampere range.

OBJECTS AND SUMMARY OF THE INVENTION

Accordingly, it is an object of the present invention to provide for the accurate measurement of DC current in a beam of charged particles.

It is another object of the present invention to provide sensitivities in the measurement of direct currents in the nano-ampere range.

Yet another object of the present invention is to provide an arrangement for the measurement of current in a beam of charged particles which does not require precise knowledge of the location of or alignment with the particle beam.

A further object of the present invention is to provide a low noise system for measuring the current of a beam of charged particles employing a superconducting detector.

A still further object of the present invention is to provide a beam position and cross-section insensitive detector for measuring the current of a beam of charged particles.

The present invention contemplates a system for measuring the direct current of a beam of charged particles. The system includes a superconducting pick-up loop in the form of a single turn toroidal electrode through which the particle beam is directed. The pick-up loop is coupled by means of a superconducting twisted pair to a detector including a Superconducting Quantum Interference Device (SQUID) and its electronics which is rendered conductive in response to a beam-generated magnetic flux within the axially symmetric pick-up loop. The current thus provided from the SQUID and its electronics to the pick-up loop establishes a magnetic field within the toroidal-shaped loop which nulls out, or cancels, the beam-generated flux therein, with the corresponding voltage representing the particle beam current. The entire system is maintained at liquid helium temperatures with measurement sensitivities on the order of nano-amperes attainable and is particularly adapted for use as a diagnostic tool for storage of antiproton particle beams.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
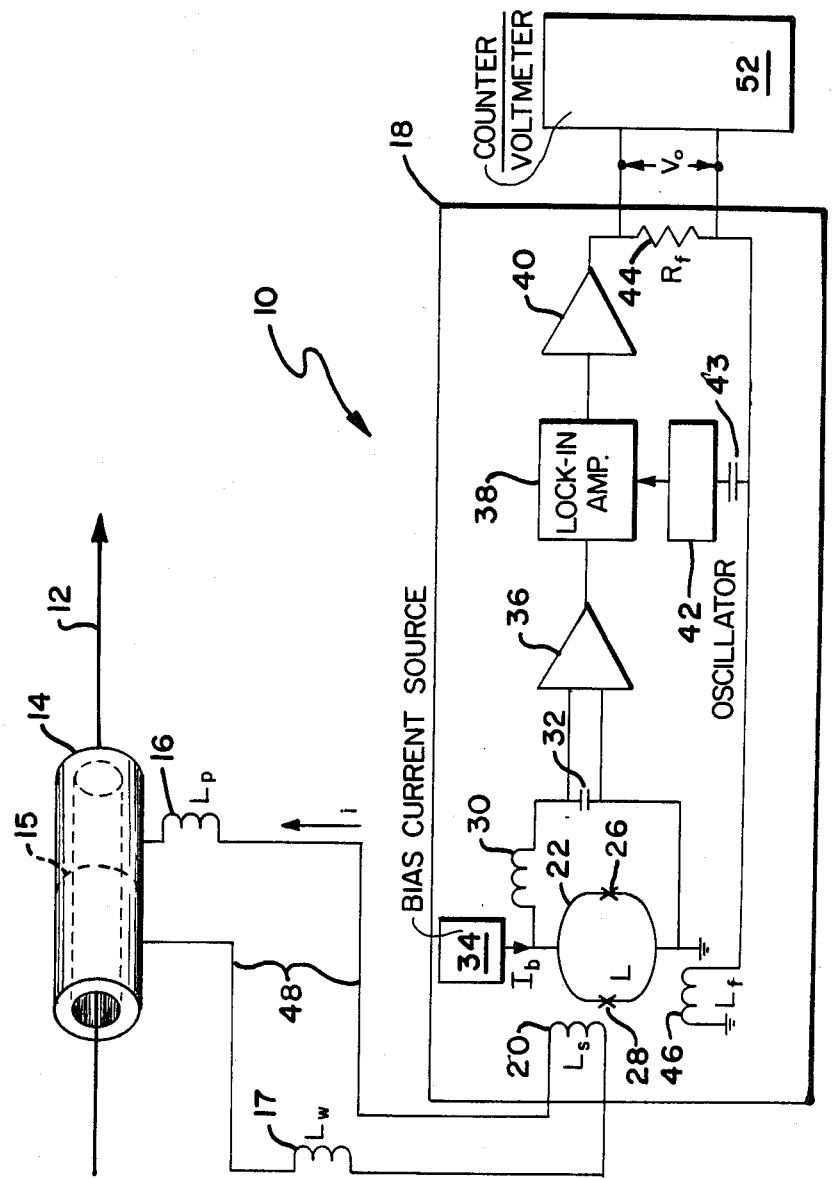
FIG. 1 is a simplified illustration in combined block and schematic diagram form of a particle beam current sensor in accordance with the present invention.

Referring to FIG. 1, there is shown in simplified block and schematic diagram form a beam current sensor 10 in accordance with the present invention.

Figure 2:
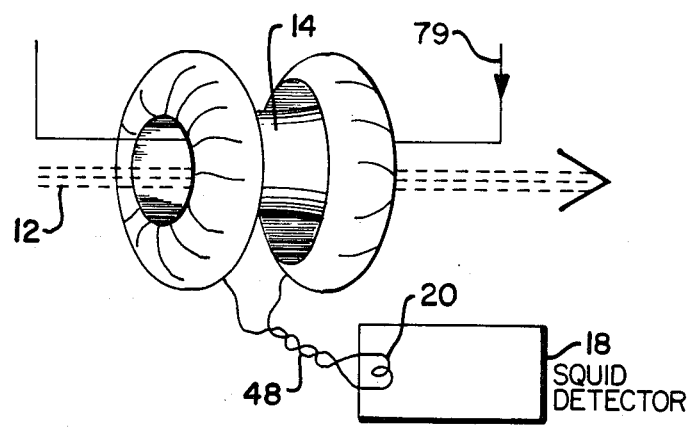
FIG. 2 is a diagrammatic illustration of a current sensing pick-up loop having an axially symmetric magnetic field in combination with a superconducting detector for use in the particle beam current sensor of FIG. 1.

The beam current sensor 10 includes a generally cylindrical, superconducting pick-up loop, or probe, 14 through which the particle beam 12 is directed generally along the axis thereof. The superconducting pick-up loop probe 14 is in the form of a hollow single loop toroid having interior and exterior surfaces and a slot 15 (shown in dotted line form in FIG. 1) spaced generally equidistant from the respective ends of the probe. The portions of the pick-up loop probe 14 separated by the median slot 15 are coupled to a superconducting inductor 20 within a SQUID detector 18 via a superconducting twisted pair 48. The self-inductance of the single loop toroid and the self-inductance of the the twisted pair 48 coupling the pick-up loop probe 14 and the SQUID detector 18 are respectively represented by inductors 16 and 17 and have values $L_P$ and $L_W$, respectively. Current is induced in the surface of the superconducting pick-up loop probe 14 by the Meisner effect in response to the particle beam 12 generated magnetic flux therein and flows along the surface thereof so as to produce a donut-shaped magnetic field-free region as shown in FIG. 2. The current thus induced in the superconducting pick-up loop probe 14 is independent of the position of the particle beam 12 transiting therethrough as well as the beam cross-section since the current in the superconducting surface will distribute itself accordingly to prevent field penetration therein. The current through the twisted pair 48 and input coil 20 opposes the magnetic field created by the particle beam 12 within the superconducting pick-up loop probe 14 in accordance with the Meisner effect. This induced current prevents the magnetic flux arising from the particle beam 12 from penetrating the toroidal shaped pick-up loop probe 14 and represents a measure of the intensity, or direct current, of the particle beam 12. The SQUID detector 18, which includes a Superconducting Quantum Interference Device (SQUID) 22, is rendered conductive in generating a magnetic flux within the pick-up loop probe 14 or the SQUID proper through inductor 46 which nulls out the effect of the magnetic flux of the particle beam 12 therein, with an output voltage $V_O$ from the SQUID detector 18 representing the particle beam current. In the discussion which follows, the terms superconducting loop and SQUID are used interchangeably in describing element 22.

The DC SQUID 22 used in the present invention is a device which includes two Josephson junctions 26, 28 in a superconducting loop of inductance L. The first and second Josephson junction 26, 28 operate as ideal tunnel junctions, each with a critical current of $I_O$ and a self-capacitance of C. Each Josephson junction is resistively shunted to eliminate hysteresis on the current-voltage (I-V) characteristic. The I-V characteristics of the superconducting loop or SQUID 22 varies with the applied flux $\phi$ threading the loop from $\phi = n\phi_O$ to $\phi = (n+\frac{1}{2})\phi_O$, where $\phi_O = h/2e$ (h=Planck's constant and e=electron charge) is the flux quantum $(2.07 \times 10^{-15}$ Wb) and n is an integer. With a constant current $I_B$, this causes the voltage across the superconducting loop or SQUID 22 to oscillate as a function of $\phi$. The I-V characteristic of the superconducting loop or SQUID 22 is a periodic function of $\phi$, such that if the superconducting loop or SQUID 22 is biased with a constant current $I_B$ from a bias current source 34 which is greater than the maximum critical current of the Josephson junctions 26 and 28, the voltage across the SQUID varies periodically. Thus, for a flux near $(2n+1) \phi_O/4$, the superconducting loop or squid 22 functions as a flux-to-voltage transducer with a transfer function of $V_\phi = (\partial V/\partial \phi)$. The equivalent flux sensitivity of the superconducting loop or SQUID 22 is determined by dividing the RMS voltage noise across the device by $V_\phi$ to obtain the equivalent RMS flux noise.

In the present invention the SQUID detector 18 is used as null detector and operates as a flux-locked loop as described below. An AC flux (typically at 100 kHz) with a peak-to-peak amplitude of $\phi_O/2$ is provided to inductor 46 within the SQUID detector 18 with the resultant 100 kHz voltage divided down by the combination of inductor 30 and capacitor 32 and provided to an amplifier 36. If the average flux within the superconducting loop or SQUID 22 is $n\phi_O$, the voltage across the SQUID detector 18 is at 200 kHz. If the flux is increased or decreased from this value, a 100 kHz component appears in the voltage across the superconducting loop or SQUID 22, with a phase dependent upon the sign of the flux change. The 100 kHz signal is amplified by amplifier 36 and provided to a lock-in amplifier 38 at the modulation frequency. An oscillator 42 provides this 100 kHz signal to the modulation/feedback coil 46 by means of AC-coupling capacitor 43 and to the lock-in amplifier 38 in order to permit the SQUID detector 18 to lock onto the minimum output of the amplifier 36. Thus, the output of the lock-in amplifier 38 is 0 at $n\phi_O$, and may be, for example, positive for $\phi = (n+\delta)\phi_O$ and negative for $\phi = (n-\delta)\phi_O$, where $\delta$ represents the change in flux and $\delta << 1$. After further amplification by means of amplifier 40, the voltage is coupled across a resistor 44 having a resistance $R_f$ in series with the modulation/feedback coil 46 in the SQUID detector 18 having an inductance $L_f$. The feedback current provided to the modulation/feedback coil 46 provides an opposing flux within the superconducting loop 22 which tends to cancel $\delta\phi_O$, with the output voltage $V_O$ being proportional to $\delta\phi_O$.

The SQUID detector used in a preferred embodiment of the present invention is the DBS model SQUID available from the S.H.E. Corporation and exhibits a superconducting input impedance of 2 microhenries which for a current of 200 nano-amperes through its input generates a full scale output voltage of 10 V with a 200 ohm output impedance. In its normal mode, the SQUID detector 18 responds from DC to 5 kHz and in its fast mode from DC to 50 kHz. The different modes corresponding to different time constants in the SQUID'S amplifiers provide a trade-off between speed and stability. Because its output is a feedback to a very sensitive quantized phenomena, i.e., the change in flux within the superconducting loop 22, its linearity is determined by Ohm's Law in the feedback resistor 44. The linearity can be further improved and the dynamic range greatly extended by automatically resetting the lock and counting the number of resets with an up-down counter/voltmeter 52. In this manner, the feedback current may be kept small and the SQUID detector 18 operates in its most sensitive scale. The TTL compatible auto-reset and reset sign outputs for the up-down counter/voltmeter 52 are included in the electronic control unit (not shown) in the aforementioned commercially available SQUID detector.

The RMS current noise of the SQUID detector 18 is 1.5 pA/$\sqrt{\text{Hz}}$ for frequencies greater than 1 Hz, or 0.5/$\sqrt{\text{f}}$pA for frequencies below 0.01 Hz. This means that on observing slow particle accumulation rates with a reduced bandwidth of 1 Hz, changes in current as low as 1.5 pA can be detected. In the case of antiprotons, for a storage ring with a revolution period of 1.6 microseconds, each antiproton contributes 0.1 pA and this detectable change corresponds to $15 \times 155$ antiprotons at any current level. The factor 155 arises from input attenuation required for keeping lock under sudden 8 $\mu$A beam steps.

Although the SQUID detector 18 itself is very fast, its feedback loop which includes resistor 44 is not. In order to maintain the SQUID detector 18 locked to the flux within the superconducting loop 22, sudden flux changes should be kept less than $\phi_O/2$. Thus, the impedance of the pick-up electrode 14 should be adjusted so that an 8 $\mu$A signals result in a flux change of less than $\phi_O/2$. For sudden partial depletion of the accumulator beam, a low pass filter inductor or eddy current shield, not shown, is needed at the SQUID input since the automatic reset requires 35 microseconds. The commercially available SQUID detector 18 offers four sensitivity ranges, where the least sensitive range is capable of measuring current changes as small as 0.2 milliamps corresponding to a beam of 0.2×155=31 milliamps. Whenn the SQUID detector 18 is cooled down, it traps the earth's magnetic field ($10^{-4}$ Tesla) which for a typical area of the superconducting loop 22 of 10 mm$^2$ corresponds to a trapped flux of 1.0 nWb or $5.0 \times 10^{+5} \phi_O$. A doubling of the number of fluxons $\phi_O$ corresponds to an input current of $(0.1 \text{ microamps}/\phi_O) \times 5.0 \times 10^{+5} \phi_O = 50$ mA, or a beam current of 7.75 A.

The pick-up loop probe 14 in a preferred embodiment is in the form of a superconducting flux transformer consisting of a single loop of cylindrical geometry around the particle beam 12. The axial symmetry of the single loop, toroidal pick-up loop probe 14 results in the particle beam-induced current therein being independent of the particle beam cross-section or the particle beam position relative to the single loop, toroidal pick-up loop probe 14. The flux, $\phi$, due to the beam current I which is prevented from entering the area defined by and within the single turn, toroidal pick-up loop probe 14 is $\phi = M_p \times I$, where $M_p \approx L_p$, which are respectively the beam-single loop pick-up loop probe 14 mutual inductance and the single loop pick-up loop probe 14 self-inductance. The current, i, thus provided to the inductor 20 at the input of the SQUID detector 18 is given by:

$$i = \phi/(L_p + L_w + L_s) \quad (1)$$

where $L_w$ is the self-inductance of the twisted leads coupling the SQUID detector 18 to the pick-up loop probe 14 and $L_s$ is the self-inductance of the SQUID detector input coil 20 (2 $\mu$H). The flux actually detected by the SQUID detector 18 and compensated for by means of the feedback signal provided via resistor 44 to the modulation/feedback coil 46 is given by the expression:

$$\phi_s = M \times i \quad (2)$$

where M is the mutual inductance between $L_s$ and the superconducting SQUID loop 22 (20 $\eta$H). Thus, the response of the beam current sensor 10 is proportional to:

$$\phi_s = (M_p/(L_p+L_w+L_s)) \times M \times I \quad (3)$$

The magnetic field at a distance r from the beam is given by the expression:

$$H = (\mu_o/2\pi) \times I/r \quad (4)$$

and the energy excluded by the self-inductance of the single loop, toroidal pick-up electrode 14 $L_p$ is given by:

$$0.5 L_p(I \cdot I) = 0.5(\mu/\mu_o) \int H \cdot H dv \quad (5)$$

Substituting and integrating Equation (5) from the inner radius a to the outer radius b for a length c, we arrive at the following expression:

$$L_p(I \cdot I)(\mu/\mu_o) \int_o^c \int_o^{2\pi} \int_a^b (\mu_o^2/4\pi^2)(I/r)^2 r dr d\theta dz \quad (6)$$

For $\mu = 1$, $$L_p = (\mu_o/2\pi) \times c \times \ln(b/a), \quad (7)$$

which expression for a=3 cm, b=6 cm, and c=10 cm yields L=0.014 $\mu$H. The inductance for a pair of wires of length s cm, diameter t cm, with the centers of the wire separated by d cm is given by the expression:

$$L_w = 0.004 \times s \times (\ln(d/t) + 0.25 - d/s) \mu H \quad (8)$$

which for s=10 cm, d=2t and t=0.02 cm yields a self-inductance of the twisted leads $L_w = 0.017$ $\mu$H. Using this value for $L_w$ and assuming $M_p \approx L_p$ and without a matching transformer, the current through the input coil 20 of the SQUID detector 18 is given by the following expression where the single loop, toroidal pick-up electrode 14 has the following dimensions—6 cm inner diameter, 12 cm outer diameter, and 10 cm long:

$$i = I/145 \quad (9)$$

The condition for maintaining the SQUID detector 18 locked onto the magnetic flux within the superconducting loop 22 under a sudden excursion of 8 $\mu$A is $\phi_s \leq \phi_O/2$. Neglecting the effects of the mutual inductance relative to the superconducting shield 80 as has been done thus far in the calculations results in a self-inductance of the twisted leads 48 coupling the SQUID detector 18 and the pick-up loop probe 14 given by the following expression:

$$L_w = (L_p \times M \times I/(\phi_O/2)) - L_p - L_s \quad (10)$$

where
$L_w = 14.0 \times 10^{-9} \times 20.0 \times 10^{-9} \times 8.0 \times 10^{-6}/(0.5 \times 2.07 \times 10^{-15}) - 14.0 \times 10^{-9} - 2.0 \times 10^{-6}$ H, or $$L_w = 151 \cdot nH \quad (11)$$

and the ratio between the beam current I and the input current i is given by:

$$i = 14 \times I/(14 + 151 + 2000) = I/155 \quad (12)$$

Figure 3:
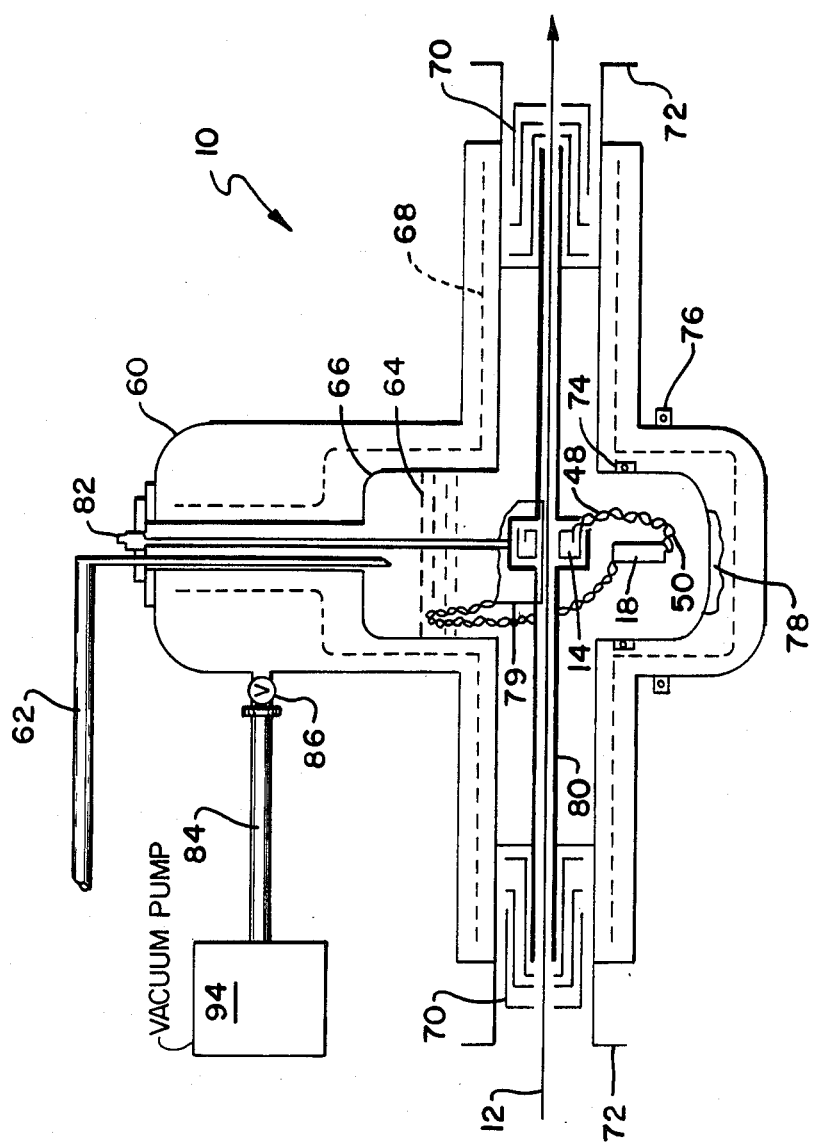
FIG. 3 is a simplified schematic diagram of a beam current sensor arrangement employing an evacuated cryostat chamber through which the particle beam is directed in accordance with the present invention.

Referring to FIG. 3, there is shown a simplified schematic diagram of a beam current sensor 10 in accordance with the present invention. The particle beam 12 is directed through the single loop, toroidal pick-up loop probe 14 which is positioned within a closed container, or dewar, 66 filled with liquid helium 64 so as to maintain the superconducting pick-up loop probe 14 at a temperature below its critical temperature. The liquid helium container 66 is positioned within a vacuum chamber 60, with a super-insulation blanket 68 positioned between the vacuum chamber 60 and the liquid helium dewar 66 for low temperature operation of the pick-up loop probe 14. A SQUID probe connector and conduit 82 provides access to the SQUID detector 18 and a means for obtaining SQUID measurement readings from within the vacuum chamber 60. A helium transfer line 62 permits liquid helium to be provided to the chamber 66, while the combination of a vacuum duct 84 and valve 86 couples a vacuum pump 94 to the vacuum chamber 60 for effecting the evacuation thereof.

The lower portions of the vacuum chamber 60 and the liquid helium dewar 66 are removable to facilitate access to the SQUID detector 18 and the pick-up loop probe 14. The detachable lower portions of the vacuum chamber 60 and the liquid helium dewar 66 are respectively provided with a viton O-ring 76 and an indium O-ring 74 to provide a vacuum seal therefor when in the closed position. A conventional molecular sieve 78 is positioned adjacent a bottom portion of the vacuum chamber 60 in order to remove stray molecules therefrom. The superconducting twisted pair of wires 48 coupling the superconducting pick-up loop probe 14 with the SQUID detector 18 is enclosed within a lead shield 50 in order to eliminate noise therefrom. A plurality of thermal shields 70 are positioned at respective ends of the vacuum chamber 60 along the particle beam trajectory which allow for the transit of the particle beam 12 therethrough, while maintaining the interior of the vacuum chamber 60 at low temperature.

The superconducting pick-up loop probe 14 is shielded from extraneous magnetic fields by means of a superconducting shield 80 in the form of a pipe aligned along the axis of the particle beam 12 and through which the particle beam passes along the length thereof. In the superconducting cylindrical shield 80 having a radius a, the magnetic field H at the distance $z \gg a$ from the end of the cylindrical shield falls off as follows:

$$|\vec{H}|_{axial} \alpha \ e^{-3.83 \ z/a} \quad (13)$$

$$|\vec{H}|_{transverse} \alpha \ e^{-1.84 \ z/a}. \quad (14)$$

Therefore, the magnetic field at a distance z from the end of the superconducting shield 80 is given by the following expression:

$$H = (\mu_0/2) \ (I/_a) = 0.1 \times \exp(-1.84 \ z/a) \quad (15)$$

$$(3.0 \times 10^{-17}/a) \approx \exp(-1.84 \ z/a).$$

such that for $a = 0.03$ m, $1.0 \times 10^{-15} \approx \exp(-61.33 \ z)$, or $z \approx 0.56$ m. Thus, the length of the superconducting shield 80 should be approximately $2 \ z \approx 1.13$ m.

The superconducting pick-up loop probe 14 will operate satisfactorily so long as the level of radioactivity within the vacuum chamber 60 does not heat it up above its critical temperature. In order to accommodate radioactivity in the vacuum chamber 60, the superconducting pick-up loop probe 14 is preferably comprised of a Type II superconductor, the critical current of which increases with increasing irradiation. By protecting the SQUID detector 18 with suitable lead shielding from the radiation of the particle beam, the SQUID detector 18 may be positioned within a few centimeters of the beam and will operate properly. The materials incorporated in a typical SQUID probe (Nb, NbTi, BeCu, brass, Si, $SiO_2$, G-10, solder and some epoxy) are not particularly sensitive to irradiation and thus would function properly within the beam current sensor 10 of the present invention.

While the modulation/feedback coil 46 has thus far been described as incorporated within the SQUID detector 18 and electromagnetically coupled to the superconducting loop 22 for providing an opposing flux tending to cancel the flux therein arising from the beam-generated signal from the pick-up loop probe 14, the modulation/feedback coil may be electromagnetically coupled directly to the pick-up loop probe 14. This arrangement is shown in FIGS. 2 and 3 where the modulation/feedback coil is identified as element 79 and is coupled to the feedback resistor 44 within the SQUID detector 18. In this arrangement, a feedback current within the modulation/feedback coil 79 gives rise to a magnetic flux within the pick-up loop probe 14 tending to cancel the beam-generated magnetic flux therein.

There has thus been shown a current sensor for measuring the DC component of a beam of charged particles employing a superconducting single loop, toroidal pick-up probe in combination with a SQUID detector which is capable of detecting currents measured in nano-amperes. The low noise arrangement of the present invention provides measurement sensitivities heretofore unavailable while the natural distribution of the current on the superconducting surface of the toroidal pick-up loop probe is capable of accurately sensing particle beam current without precisely determining the location of the particle beam or compensating for its cross-section.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The embodiments of the invention in which an exclusive property or privilege is claimed are defined as follows:

1. A sensor for measuring the current of a beam of charged particles, comprising:
   a. superconducting probe means comprised of a hollow probe having interior and exterior surfaces and surrounding the beam of charged particles, having a continuous slot surrounding the beam of charged particles whereby said interior and exterior surfaces join each other, said slot thereby forming first and second ends of said superconducting probe means such that a current is induced on said exterior surface of said superconducting probe means, said induced current on said exterior surface acting to exclude magnetic flux associated with the beam from interior regions of said probe means in accord with the Meisner effect; and
   b. superconducting detection means coupled to said probe means and responsive to the current induced therein for providing an output voltage representing the current of the beam of charged particles.

2. A sensor in accordance with claim 1 wherein said hollow probe is a hollow toroid.

3. A sensor in accordance with claim 2 wherein said slot is on the outer circumference of said superconducting hollow toroid probe.

4. A sensor in accordance with claim 3 wherein said superconducting probe is comprised of niobium.

5. A sensor in accordance with claim 1 further comprising a superconducting enclosure positioned around said probe means and aligned with the beam of charged particles such that said beam transits therethrough in providing a magnetic shield for said probe means.

6. A sensor in accordance with claim 5 wherein said enclosure is comprised of lead.

7. A sensor in accordance with claim 3, further comprising a first superconducting wire coupled to said first end of said probe and a second superconducting wire coupled to said second end of said probe, said first and second superconducting wires twisted together and coupling said probe means to said detection means.

8. A sensor in accordance with claim 1 further comprising low temperature containment means enclosing said probe means and said detection means.

9. A sensor in accordance with claim 8 wherein said containment means includes a liquid helium filled closed container.

10. A sensor in accordance with claim 8 further comprising particle collection means positioned in said containment means for removing stray particles therein not in said particle beam.

11. A sensor in accordance with claim 1 wherein said detection means includes a superconducting quantum interference device.

12. A sensor in accordance with claim 11 wherein said superconducting quantum interference device includes at least one Josephson junction in combination with a superconducting coil loop.

* * * * *